Sept. 9, 1969 HUNG CHANG LIN 3,466,511

INSULATED GATE FIELD EFFECT TRANSISTORS WITH MEANS PREVENTING OVERVOLTAGE FEEDTHROUGH BY AUXILIARY STRUCTURE PROVIDING BIPOLAR TRANSISTOR ACTION THROUGH SUBSTRATE

Filed May 5, 1967

WITNESSES:

Leon M. Garman

James F. Young

INVENTOR

Hung Chang Lin

BY Gordon H. Telfer

ATTORNEY

United States Patent Office 3,466,511
Patented Sept. 9, 1969

3,466,511

INSULATED GATE FIELD EFFECT TRANSISTORS WITH MEANS PREVENTING OVERVOLTAGE FEEDTHROUGH BY AUXILIARY STRUCTURE PROVIDING BIPOLAR TRANSISTOR ACTION THROUGH SUBSTRATE

Hung Chang Lin, Silver Spring, Md., assignor to Westinghouse Electric Corporation., Pittsburgh, Pa., a corporation of Pennsylvania Filed May 5, 1967, Ser. No. 636,378
Int. Cl. H01l *11/00, 11/14, 5/00*
U.S. Cl. 317—235 4 Claims

ABSTRACT OF THE DISCLOSURE

An insulated gate field effect transistor structure that in addition to usual elements has associated therewith an auxiliary structure to prevent feedthrough of spurious overvoltages between the input and output. The auxiliary structure provides bipolar transistor action with the substrate region and includes a base region that may be like the source and drain regions of the field effect transistor, an emitter region within the base region, and a collector region provided by the common substrate. A collector contact region is provided in a configuration that surface isolates the source and drain from the base region. Selected reverse bias voltages are applied to the emitter and collector so that signals applied to the base feed through the bipolar transistor if they are spurious signals exceeding true signal magnitude.

BACKGROUND OF THE INVENTION

Field of the invention.—This invention relates to insulated gate or MOS type transistors of the type generally characterized by source and drain regions in a substrate region of opposite conductivity type and a control electrode over the channel region between the source and drain regions and insulated therefrom by a layer of insulating material. MOS is an acronym for metal-oxide-semiconductor. It is to be understood, however, that the term is used in a generally descriptive sense and that the insulating layer may be other than an oxide. For example, the insulating layer may be a layer of a nitride compound or a layer of a non-homogeneous composition; it may be formed by reaction with the semiconductor material or by deposition thereon.

Description of the prior art.—MOS type transistors are useful in some applications because the signal voltage between the source and drain regions is electrically isolated from the control voltage applied to the gate electrode. This permits analog switching of the source to drain signal without loading the generator by the control signal. An example of applications in which this type of MOS transistor operation is attractive is in telemetry applications wherein such analog switches are becoming popular. The MOS transistor has the added advantage that the offset voltage between the source and the drain is minimized due to the absence of junction barriers.

In such applications the signal voltage is ordinarily very small, for example, less than about 100 millivolts. There may, however, be a spurious signal present at the input. The spurious signal may be due to a variety of causes of which the principal ones include interference signals and line voltage surges. During the period of operation when the switch is intended to be off, the spurious signal should not feed through the switch causing cross-talk at the output.

To prevent feedthrough of the spurious signal or overvoltage one may bias the substrate region to a potential nearly equal to the maximum spurious voltage expected and of a polarity tending to reverse bias the source and drain regions. The gate should also be biased to a comparable voltage at least equal to the maximum spurious voltage contemplated minus the threshold voltage. The threshold voltage is that voltage required to be applied to the gate electrode to provide conduction between the source and drain regions. These requirements make it necessary that the control voltage be greater than that otherwise necessary by an amount equal to the spurious voltage. This presents power supply problems because that magnitude of control voltage may not be readily obtainable. In any case it is undesirable that this additional requirement be imposed on the control voltage.

SUMMARY OF THE INVENTION

The present invention provides a means to avoid the effect of the spurious overvoltage without imposing additional requirements on the control voltage by clamping the spurious voltage to a low value so that no feedthrough can take place. An auxiliary structure is provided that provides, upon application of an overvoltage, transistor action with the substrate that is of relatively high resistivity so the current is limited to a low value. Additionally, the MOS transistor, or transistors, if they are disposed in an array, are surrounded by a region of the same type as the substrate region and of lower resistivity that has a fixed potential applied thereto to insure source and drain junctions do not become forward biased.

Conveniently, the auxiliary structure may include a base region of the same conductivity type and impurity concentration gradient as the source and drain regions so they all may be formed in the same diffusion operation. An emitter region inside the additional region and a guard ring region may be performed in a single diffusion producing regions of the same depth and impurity concentration gradient.

In operation the additional referred to region is connected together with the MOS transistor source region to the signal source that may include a spurious voltage of a magnitude in excess of that required to forward bias the junction. The emitter region and the auxiliary structure is maintained at a voltage about equal to the junction turn on voltage drop while the region providing the guard ring is maintained at a voltage equal to about twice the voltage drop required to turn on the junction, both voltages being of a polarity to provide an ordinarily reverse bias across the junction. The structure may be conventionally formed, it being preferred that the substrate region be of relatively high resistivity such as 50 to 100 ohm-centimeters or more.

DESCRIPTION OF THE PREFERRED EMBODIMENTS

Figure 1:
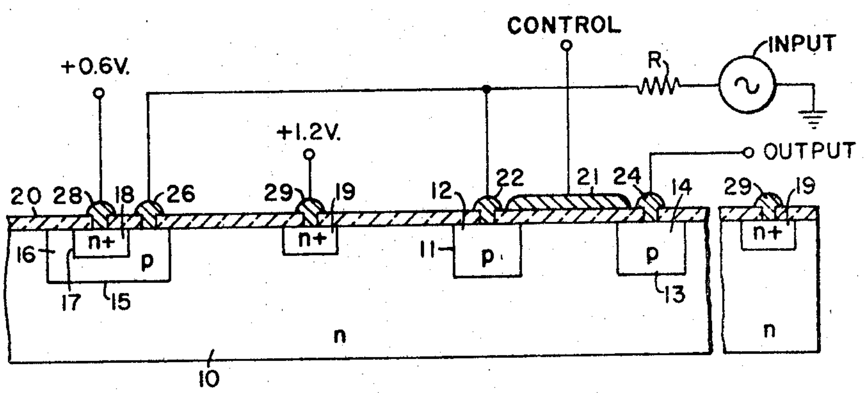
FIGURE 1 is a partial sectional view of a semiconductor structure in accordance with the present invention with typical circuit connections.
Figure 2:
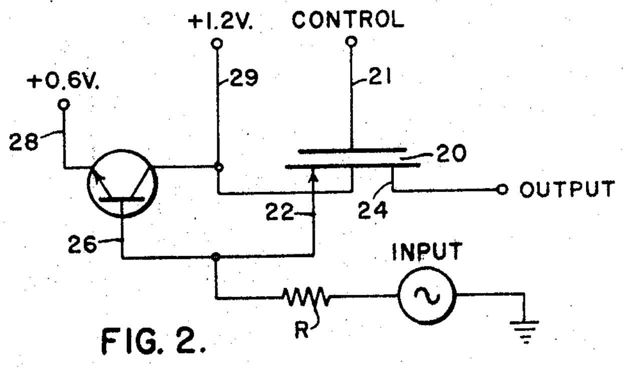
FIG. 2 is an approximate equivalent circuit of the arrangement illustrated in FIG. 1.

Referring to the figures of the drawing it is illustrated that the structure includes a substrate region 10 of a first conductivity type, N type in this example. Within a first surface of the substrate region 10 are source and drain regions 12 and 14 forming PN junctions 11 and 13, respectively, with the substrate region 10. The source and drain regions define a channel region therebetween in the surface of the substrate. At least the channel region is covered by a layer of insulating material 20. Electrical contact means in the form of metallic conductors 21, 22, and 24 are disposed on the insulating layer over the channel region and on the source and drain regions 12 and 14, respectively.

As thus far described the structure may be in accordance with previous P channel MOS type analog switches.

In another portion of the structure an additional P type region 16 is disposed within the surface of the substrate region. First and second highly doped N type regions 18 and 19 are also disposed on the surface, the first being within the additional P type region and the second being within the original substrate material.

The semiconductor structure may be formed by a straightforward application of known fabrication techniques. The additional P type region 16 may be formed in the same diffusion operation as that used for forming the source and drain regions 12 and 14 and thus it will extend the same distance within the substrate region and have the same impurity concentration gradient. The first and second N type regions may be formed together in a single diffusion operation thus extending to the same depth within the structure and having the same impurity concentration gradient.

The structure may be formed using monocrystalline, device quality silicon as the starting material doped with a donor impurity to provide a relatively high resistivity such as about 50 to 100 ohm-centimeters or more. The P type regions 12, 14 and 16 may be formed by selective diffusion of the boron impurity through an oxide mask to provide regions having a depth of about 3 to 5 microns and a surface concentration of $10^{17}$ to $10^{19}$ atoms per cubic centimeter. The N+ regions 18 and 19 may be formed by selective diffusion of a phosphorus impurity through an oxide mask to provide regions having a depth of about 1 micron and a surface concentration of greater than $10^{20}$ atoms per cubic centimeter.

At the time of diffusing the source, drain and additional regions 12, 14, and 16 there may be formed additional source and drain regions for other MOS type transistors. In many applications it is desirable to provide an array of such switches. The second N+ region 19 completely encircles one or more MOS type transistor structures.

In operation an input signal source is applied both to the contact 22 to the source region and the contact 26 to the additional P type region 16 through a resistor R that is of a magnitude of, for example, about 1000 ohms. The resistor is the equivalent resistance of the generator. It is assumed that the signal will be small such as about 0.1 volt while there may be present in the input a spurious voltage of considerably larger magnitude such as about 15 volts. It can be seen that if this spurious voltage were applied merely to the source region that the source junction 11 would become forward biased and feedthrough to the output would occur. This would be the case in the event of any spurious voltage in excess of that required to turn-on the PN junction 11 (the junction threshold voltage). In silicon at normal concentration levels this voltage is about 0.6 volt.

In the auxiliary structure the transistor is provided by the regions 18, 16, and the substrate 10 with the N+ region 19 providing the connection to the substrate. A reverse biasing voltage, the maximum signal voltage, say equal to one junction threshold voltage, is applied to the contact 28 on the N+ region 18. A voltage of magnitude greater than the voltage applied to the contact 28, say equal to two times the junction threshold voltage, and also of reverse biasing polarity is applied to the contact 29 on the N+ guard ring 19. When the spurious voltage is greater than two times the junction threshold voltage or 1.2 volts, the junction 17 between regions 16 and 18 becomes forward biased. The junction 15 then acts as a collector junction and transistor action results. Because of the high resistivity substrate 10 the series collector resistance, $R_C'$, limits the current to a low value. The application of the 1.2 volts to the N+ guard ring 19 insures that the source does not become forward biased at any time before the junction 17. Since the N+ region 19 completely surrounds the MOS transistors, the substrate underneath the gate contact assumes the potential of the N+ region 19 thus to insure isolation in the MOS structure. Thus any spurious signal in excess of the maximum true signal, 0.6 volt in this example, does not affect the operation of the MOS transistor.

While the present invention has been shown and described in a few forms only it will be apparent that various changes may be made without departing from the spirit and scope thereof including, merely as examples, use of different semiconductor materials, dopants, dimensions, surface concentrations, insulating material, fabricating methods, electrical signal levels, as well as others.

I claim:

1. An insulated gate field effect transistor structure comprising a substrate region of a first conductivity type, source and drain regions of a second conductivity type disposed within a surface of said substrate region and forming PN junctions therewith, said source and drain regions defining between them a channel region at said surface of said substrate region; a layer of insulating material disposed on said surface and at least covering said channel region; electrical contact means on the surface of said insulating layer over said channel region and on each of said source and drain regions; an additional region of said second conductivity type in said surface of said substrate region; a first region of said first conductivity type disposed within said additional region, a second region of said first conductivity type disposed within said surface of said substrate region; said second region completely blocking any direct path over said substrate surface between said additional region and each of said source and drain regions; said first and second regions being doped to a resistivity appreciably lower than that of said substrate region; and electrical contact means on each of said additional region and said first and second regions.

2. The subject matter of claim 1 wherein: a control signal source is connected to said electrical contact means on said insulating layer over said channel region; a signal source is connected to said electrical contact means on said source region and on said additional region; said signal source providing a signal of a voltage magnitude less than that necessary to forward bias said PN junction formed by said source region with said substrate and also a spurious voltage that may be larger than that necessary to forward bias said PN junction; said electrical contact means on said first region having applied thereto a voltage of magnitude approximately equal to that required to forward bias said PN junctions and of reverse polarity; said electrical contact means on said second region having applied thereto a voltage approximately equal to at least twice that required to forward bias said PN junctions and of reverse polarity.

3. The subject matter of claim 1 wherein: said device comprises a plurality of source regions and a plurality of drain regions and said second region of first conductivity type completely surrounds said plurality of source and drain regions while said additional region of said second conductivity type is not surrounded by said second region of first conductivity type.

4. The subject matter of claim 1 wherein: said source, drain and additional regions extend the same first distance from said surface and have the same first impurity concentration gradient; said first and second regions of said first conductivity type extend the same second distance from said surface and have the same second impurity concentration gradient.

References Cited

UNITED STATES PATENTS 3,354,362 11/1967 Zueleeg ------------ 317—235

JOHN W. HUCKERT, Primary Examiner

M. EDLOW, Assistant Examiner

U.S. Cl. X.R.

307—237, 303, 304; 317—234